(12) United States Patent
Javorka et al.

(10) Patent No.: US 9,082,876 B2
(45) Date of Patent: Jul. 14, 2015

(54) INTEGRATED CIRCUITS AND METHODS FOR FABRICATING INTEGRATED CIRCUITS WITH GATE ELECTRODE STRUCTURE PROTECTION

(71) Applicant: GLOBALFOUNDRIES, Inc., Grand Cayman (KY)

(72) Inventors: Peter Javorka, Radeburg (DE); Ralf Richter, Radebeul (DE); Stefan Flachowsky, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 13/842,103

(22) Filed: Mar. 15, 2013

(65) Prior Publication Data

US 2014/0273367 A1    Sep. 18, 2014

(51) Int. Cl.
  *H01L 21/331*   (2006.01)
  *H01L 21/38*    (2006.01)
  *H01L 21/8238*  (2006.01)
  *H01L 21/266*   (2006.01)

(52) U.S. Cl.
  CPC ...... *H01L 21/823807* (2013.01); *H01L 21/266* (2013.01); *H01L 21/823814* (2013.01); *H01L 21/823842* (2013.01)

(58) Field of Classification Search
  CPC ............................ H01L 21/266; H01L 21/8238
  USPC .................................................. 438/217, 369
  See application file for complete search history.

(56) References Cited

U.S. PATENT DOCUMENTS

| | | | |
|---|---|---|---|
| 2010/0136762 A1* | 6/2010 | Beyer et al. | 438/301 |
| 2010/0224938 A1* | 9/2010 | Zhu | 257/369 |
| 2011/0159657 A1* | 6/2011 | Griebenow et al. | 438/303 |
| 2012/0187459 A1* | 7/2012 | Pan et al. | 257/288 |

* cited by examiner

*Primary Examiner* — Christine Enad
(74) *Attorney, Agent, or Firm* — Ingrassia Fisher & Lorenz, P.C.

(57) ABSTRACT

Integrated circuits and methods for fabricating integrated circuits are provided herein. In an embodiment of a method for fabricating integrated circuits, a P-type gate electrode structure and an N-type gate electrode structure are formed overlying a semiconductor substrate. The gate electrode structures each include a gate electrode that overlies a gate dielectric layer and a nitride cap that overlies the gate electrode. Conductivity determining ions are implanted into the semiconductor substrate using the P-type gate electrode structure and the N-type gate electrode structure as masks to form a source region and a drain region for the P-type gate electrode structure and the N-type gate electrode structure. The nitride cap remains overlying the N-type gate electrode structure during implantation of the conductivity determining ions into the semiconductor substrate to form the source region and the drain region for the N-type gate electrode structure.

4 Claims, 4 Drawing Sheets

INTEGRATED CIRCUITS AND METHODS FOR FABRICATING INTEGRATED CIRCUITS WITH GATE ELECTRODE STRUCTURE PROTECTION

TECHNICAL FIELD

The technical field generally relates to integrated circuits and methods for fabricating integrated circuits, and more particularly relates to integrated circuits and methods for fabricating integrated circuits with gate electrode structure protection.

BACKGROUND

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode that overlies the channel. The ICs are usually formed using both P-channel FETs (PMOS transistors or PFETs) and N-channel FETs (NMOS transistors or NFETs) and the IC is then referred to as a complementary MOS or CMOS circuit. Some semiconductor ICs, such as high performance microprocessors, can include millions of FETs. For such ICs, increasing transistor density and thus decreasing transistor size has traditionally been a high priority in the semiconductor manufacturing industry. Transistor performance, however, must be maintained even as the transistor size decreases.

As advanced metal-oxide-semiconductor (MOS) technology continues to scale and move into the deep-sub-micron geometry dimensions, the optimization of source/drain regions has become complex. Conventional techniques that are employed to form the source regions and the drain regions can negatively impact the gate electrode structures. In particular, certain ion implantation techniques may cause thickening of a top portion of the gate electrode, resulting in a mushroom geometry in the gate electrode structures that could cause shorting upon formation of interconnects that electrically connect to the source region and the drain region of the gate electrode structures. An exemplary photograph of a gate electrode structure having a mushroom geometry is shown in FIG. 1. Also due to potential shorting upon formation of the interconnects, thicker spacers adjacent to the gate electrode structures may be required to ensure that the interconnects do not contact the gate electrode structures, especially when the mushroom geometry exists in the gate electrode structures.

Accordingly, it is desirable to provide methods of forming integrated circuits with minimized mushroom geometry in the gate electrode structures after formation of source regions and drain regions for the gate electrode structures. It is also desirable to minimize spacer thickness for spacers adjacent to the gate electrode structures while avoiding shorting, and to provide integrated circuits with the minimized spacer thickness. Furthermore, other desirable features and characteristics of the present invention will become apparent from the subsequent detailed description of the invention and the appended claims, taken in conjunction with the accompanying drawings and this background of the invention.

BRIEF SUMMARY

Integrated circuits and methods for fabricating integrated circuits are provided herein. In an embodiment of a method for fabricating integrated circuits, a P-type gate electrode structure and an N-type gate electrode structure are formed overlying a semiconductor substrate. The gate electrode structures each include a gate electrode that overlies a gate dielectric layer and a nitride cap that overlies the gate electrode. Conductivity determining ions are implanted into the semiconductor substrate using the P-type gate electrode structure and the N-type gate electrode structure as masks to form a source region and a drain region for the P-type gate electrode structure and the N-type gate electrode structure. The nitride cap remains overlying the N-type gate electrode structure during implantation of the conductivity determining ions into the semiconductor substrate to form the source region and the drain region for the N-type gate electrode structure.

In another embodiment of a method for fabricating integrated circuits, a P-type gate electrode structure and an N-type gate electrode structure are formed overlying a semiconductor substrate. The gate electrode structures each include a gate electrode that overlies a gate dielectric layer and a nitride cap that overlies the gate electrode. Trenches are etched into the semiconductor substrate adjacent to the P-type gate electrode structure, and a semiconductor material is epitaxially grown within the trenches. Conductivity determining ions are implanted into the semiconductor substrate using the P-type gate electrode structure as a mask to form a source region and a drain region for the P-type gate electrode structure. The nitride cap is removed from the P-type gate electrode structure after epitaxially growing the semiconductor material within the trenches and prior to implanting the conductivity determining ions into the semiconductor substrate to form the source region and the drain region for the P-type gate electrode structure. Conductivity determining ions are implanted into the semiconductor substrate using the N-type gate electrode structure as a mask to form a source region and a drain region for the N-type gate electrode structure. The nitride cap is removed from the N-type gate electrode structure after implanting the conductivity determining ions into the semiconductor substrate to form the source region and the drain region for the N-type gate electrode structure.

In another embodiment, an integrated circuit includes a P-type gate electrode structure and an N-type gate electrode structure that overlie a semiconductor substrate. The gate electrode structures each include a gate electrode that overlies a gate dielectric layer. First sidewall spacers that include a nitride are disposed adjacent to the P-type gate electrode structure and the N-type gate electrode structure. Third sidewall spacers that include a nitride are only disposed adjacent to the P-type gate electrode structure. The first sidewall spacers that are adjacent to the N-type gate electrode structure are thinner than the first sidewall spacers that are adjacent to the P-type gate electrode structure.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
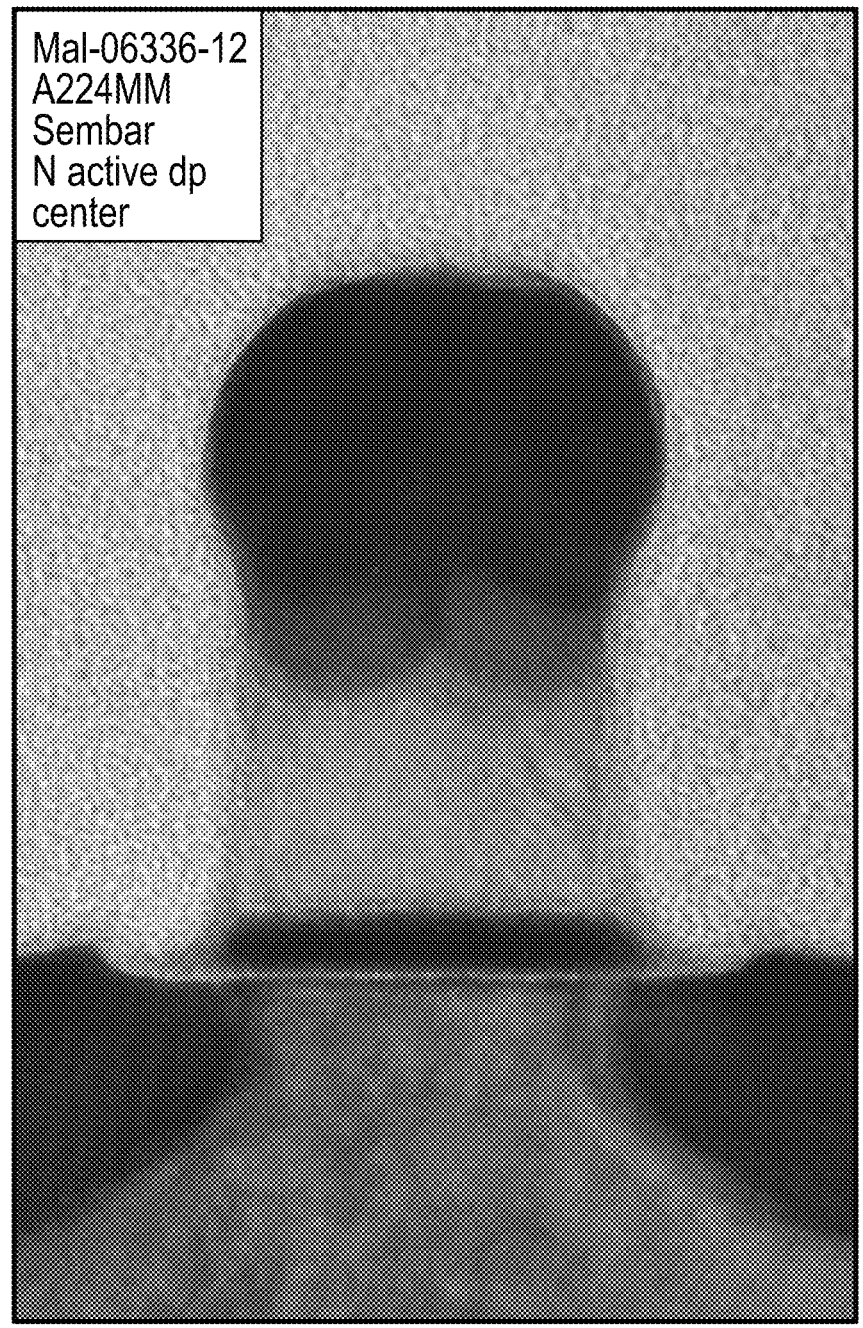
FIG. 1 is a photograph of a gate electrode structure having a mushroom geometry in accordance with the prior art

The following detailed description is merely exemplary in nature and is not intended to limit the various embodiments or the application and uses thereof. Furthermore, there is no intention to be bound by any theory presented in the preceding background or the following detailed description.

Methods for fabricating integrated circuits are provided herein. In particular, the integrated circuits formed in accordance with the methods that are described herein include a semiconductor substrate, a source region and a drain region disposed in the semiconductor substrate, a channel region defined between the source region and the drain region in the semiconductor substrate, a gate dielectric layer overlying the channel region, and a gate electrode structure overlying the gate dielectric layer.

Without being bound by any particular theory, it is believed that ion implantation techniques that are employed to form the source region and the drain region for a conventional N-type gate electrode structure, particularly phosphorus ion implantation, result in thickening of a top portion of the gate electrode and produce a mushroom geometry in the conventional N-type gate electrode structure. However, ion implantation techniques that are employed to form the source region and the drain region for a conventional P-type gate electrode structure generally do not result in the mushroom geometry in the conventional P-type gate electrode structure. A nitride cap is generally formed overlying all gate electrode structures, including the P-type gate electrode structure and the N-type gate electrode structure, during integrated circuit fabrication. The nitride cap protects the gate electrode structures during trench or cavity etching and epitaxial growth of semiconductor material in the semiconductor substrate adjacent to the P-type gate electrode structure, although the nitride cap is generally only formed over the N-type gate electrode structure for convenience and is not required for protection of the N-type gate electrode structure. The nitride cap is generally removed from all gate electrode structures, including the P-type gate electrode structure and the N-type gate electrode structure, after epitaxial growth of the semiconductor material in the trenches or cavities for the P-type gate electrode structure. Ion implantation is then conducted to form the source regions and the drain regions for all of the gate electrode structures, after removal of the nitride cap.

In accordance with the various embodiments of the methods contemplated herein, and as described in further detail below, the nitride cap remains in place overlying the N-type gate electrode structure during implantation of the conductivity determining ions into the semiconductor substrate to form the source region and the drain region for the N-type gate electrode structure, thereby protecting the N-type gate electrode structure during ion implantation and preventing formation of the mushroom geometry in the N-type gate electrode structure. Further, because formation of mushroom geometry in the N-type gate electrode structure is avoided, integrated circuits are contemplated that include spacers adjacent to the N-type gate electrode structure with minimized thickness but that still provide effective insulation of the N-type gate electrode structure and that also prevent shorting. Minimizing the spacer thickness for the N-type gate electrode structure enables the size of a NMOS transistor that includes the N-type gate electrode structure to be effectively reduced.

Figure 2:
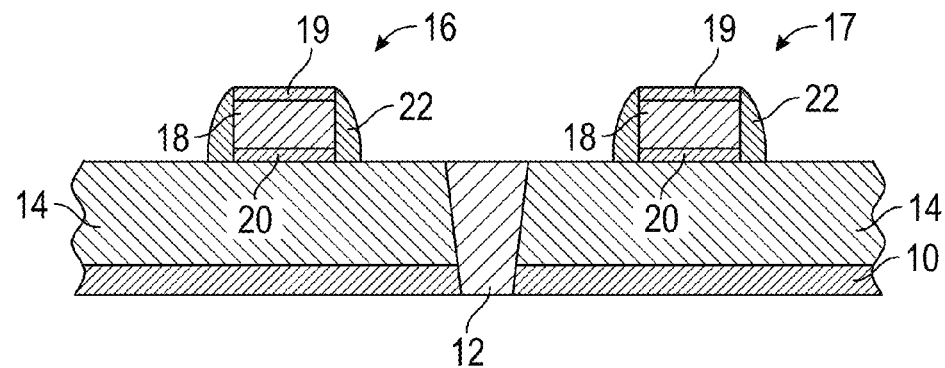
FIGS. 2-10 illustrate, in cross section, a method for fabricating a portion of an integrated circuit in accordance with an exemplary embodiment.

An exemplary method of forming an integrated circuit will now be described with reference to FIGS. 2-10, with a portion of an integrated circuit 54 formed in accordance with the exemplary method shown in FIG. 10. Referring to FIG. 2, a semiconductor substrate 10 including a first semiconductor material is provided. The first semiconductor material may be any semiconductor material that is known for industrial use in electronic devices. Examples of the first semiconductor material include, but are not limited to, those chosen from silicon, silicon germanium (SiGe), germanium (Ge), gallium arsenide (GaAs), or indium phosphide (InP). For example, in an embodiment, the first semiconductor material is silicon, and the silicon is present in an amount of from about 95 to about 100 mol %, such as from about 99 to about 100 mol %, based upon the total amount of atoms in the semiconductor substrate 10. The silicon may be substantially pure, i.e., dopants and/or impurities are present in amounts of less than or equal to 1 mol % based upon the total amount of atoms in the semiconductor substrate 10 and are desirably absent from the semiconductor substrate 10.

In an embodiment and as shown in FIG. 2, shallow trench isolation (STI) structures 12 are formed in the semiconductor substrate 10, and wells 14 are formed in the semiconductor substrate 10 through conventional fabrication techniques. The wells 14 have a dopant concentration, or a concentration of conductivity determining ions, and the conductivity determining ions may be a P-type or N-type conductivity determining ions, depending upon whether a PMOS transistor or NMOS transistor is to be formed. Each well 14 contains opposite conductivity determining ions from the source region and drain region of transistors that are to be formed therein. For example, when the source region and drain region for a transistor include P-type conductivity determining ions, the well 14 includes N-type conductivity determining ions, and vice versa. Typical N-type conductivity determining ions include, but are not limited to, phosphorus, arsenic, antimony, and combinations thereof. Typical P-type conductivity determining ions include, but are not limited to, boron, aluminum, gallium, indium, and combinations thereof.

In an embodiment and as also shown in FIG. 2, a P-type gate electrode structure and an N-type gate electrode structure are formed overlying the semiconductor substrate 10. As used herein, the term "overlying" is used to encompass both "over" and "on". In this regard, one feature that overlies a second feature may include intervening features, such as a layer, interposed between the one feature and the second feature within the scope of the term "overlying". Alternatively, the one feature may be formed directly on a surface of the second feature within the scope of the term "overlying". For illustrative purposes, FIGS. 2-10 show one P-type gate electrode structure 16 for a P-type transistor, and one N-type gate electrode structure 17 for an N-type transistor, although it is to be appreciated that the integrated circuits described herein may include a plurality of P-type gate electrode structures and a plurality of N-type gate electrode structures. As shown in FIG. 2, each of the gate electrode structures 16, 17 include a gate electrode 18 that overlies a gate dielectric layer 20 (in the case of High-K Metal Gate technologies, it is to be appreciated the metals are different for N-type and P-type gate electrodes). The gate electrode structures 16, 17 may be part of a metal-oxide-semiconductor (MOS) transistor device that is formed on the semiconductor substrate 10. Although the term 'MOS transistor device' properly refers to a device having a metal gate electrode and an oxide gate insulator, that term is used herein to refer to any semiconductor device that includes a conductive gate electrode (whether metal or other conductive material) that is positioned overlying a gate insulator (whether oxide or other insulator) which, in turn, is positioned overlying the semiconductor substrate 10. The gate electrode structures 16, 17 may be formed through conventional techniques. The gate dielectric layer 20 may include an insulator material such as, but not limited to, silicon dioxide, silicon oxide, silicon nitride, or the like. The gate electrode 18 may be formed from conventional materials including copper, silver, and doped or undoped polycrystalline silicon.

Referring to FIG. 2, a nitride cap 19 is formed overlying the gate electrode 18 to provide protection to the gate electrode 18 during fabrication of the integrated circuit. The nitride cap 19 may be formed from any nitride such as, for example, silicon nitride. First sidewall spacers 22 are then formed adjacent to the gate electrode structures 16, 17, on opposite sides thereof, to insulate the gate electrode 18 and to align ion implantation into the semiconductor substrate 10 as described in further detail below. In this regard, the first sidewall spacers 22 are formed prior to implanting the conductivity determining ions into the semiconductor substrate 10. The first sidewall spacers 22 are formed from a nitride, which may have the same nominal composition as the nitride cap 19. In addition to the first sidewall spacers 22, additional sidewall spacers are described in the following paragraphs. It is to be appreciated that designations of "first", "second", and "third" sidewall spacers are used only for purposes of distinguishing between the different sidewall spacers and such designations are not to be interpreted as limiting or as requiring any particular order.

Figure 3:
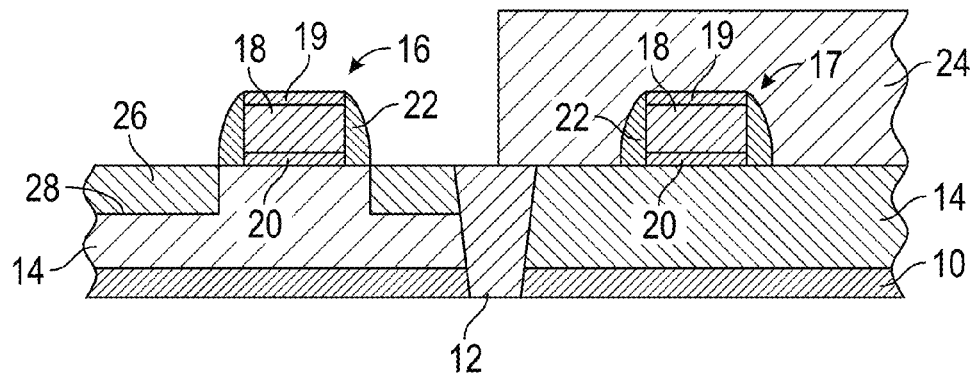

In an embodiment and as shown in FIG. 3, one of the gate electrode structures 17 is selectively masked with an epitaxy mask 24 to produce a masked gate electrode structure 17 and an unmasked gate electrode structure 16. In the embodiment shown, the masked gate electrode structure 17 is the N-type gate electrode structure 17, and the unmasked gate electrode structure 16 is the P-type gate electrode structure 16. The epitaxy mask 24 may be formed from any masking material, such as silicon dioxide, and shields the masked N-type gate electrode structure 17 to enable formation of epitaxially-grown semiconductor regions 26 adjacent to the unmasked P-type gate electrode structure 16. In particular, in an embodiment and as also shown in FIG. 3, trenches 28 are etched into the semiconductor substrate 10 adjacent to the unmasked P-type gate electrode structure 16, using the first sidewall spacers 22 as an etch mask. For example, in an embodiment, the trenches 28 (or cavities) may be anisotropically etched in the semiconductor wafer 10 with a plasma etching technique using a Cl or $HBr/O_2$ chemistry, and the trenches 28 or cavities may be U-shaped or sigma-shaped. A semiconductor material is epitaxially grown within the trenches 28 on the exposed crystal lattice of the semiconductor substrate 10 to form the epitaxially-grown semiconductor regions 26. The epitaxially-grown semiconductor regions 26 may provide compressive stress within the semiconductor substrate 10. In an embodiment, the semiconductor substrate 10 is silicon and the epitaxially-grown semiconductor material is silicon germanium (SiGe), which provides compressive stress within the silicon semiconductor substrate 10. The epitaxially-grown semiconductor material only forms on exposed areas of semiconductor material of the semiconductor substrate 10, and little to no epitaxially-grown semiconductor material generally forms on the epitaxy mask 24.

Figure 4:
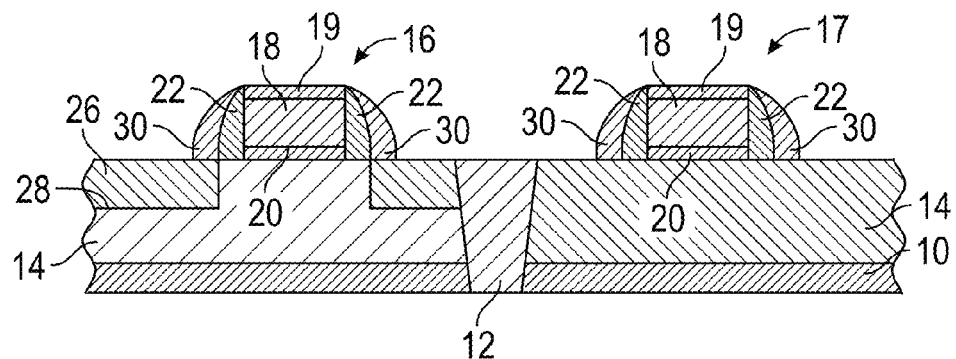

Referring to FIG. 4, the epitaxy mask is removed after epitaxially growing the semiconductor material to expose the N-type gate electrode structure 17 and second sidewall spacers 30 are formed adjacent to the first sidewall spacers 22, including adjacent to both the N-type gate electrode structure 17 and the P-type gate electrode structure 16 on opposite sides thereof, prior to implanting the conductivity determining ions into the semiconductor substrate 10. The second sidewall spacers 30 are formed to partially shield the first sidewall spacers 22 during removal of the nitride cap 19 from the P-type gate electrode structure 16 and are formed from a material, such as an oxide, having a different etch rate from the first spacer 22 when etched with the same etchant. A suitable oxide that may be used to form the second sidewall spacer 30 is silicon dioxide.

Figure 5:
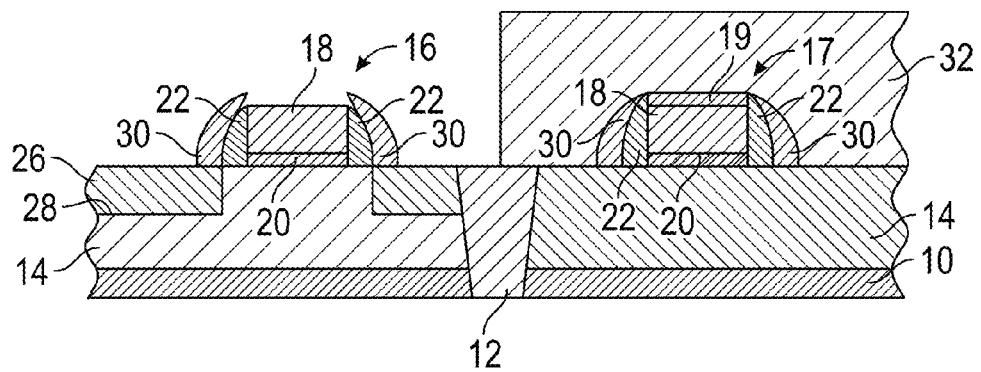

Referring to FIG. 5, in an embodiment, the nitride cap 19 is removed from the P-type gate electrode structure 16 after forming the second sidewall spacers 30 and prior to implanting the conductivity determining ions into the semiconductor substrate 10 to form the source region and the drain region for the P-type gate electrode structure 16. However, the nitride cap 19 remains in place overlying the N-type gate electrode structure 17. Referring to FIG. 5, an etch mask 32 may be selectively formed over the N-type gate electrode structure 17 to prevent the nitride cap 19 that overlies the N-type gate electrode structure 17 from being removed while the nitride cap 19 that overlies the P-type gate electrode structure 16 are removed. The etch mask 32 may be formed from the same materials as the epitaxy mask as described above, including silicon dioxide. The nitride cap 19 that overlies the P-type gate electrode structure 16 may be removed through anisotropic etching with a suitable nitride etchant such as, but not limited to, phosphoric acid. A portion of the first sidewall spacers 22 that are adjacent to the P-type gate electrode structure 16 is also removed, prior to implanting the conductivity determining ions into the semiconductor substrate 10. Because the first sidewall spacers 22 are also formed from a nitride, unprotected portions of the first sidewall spacers 22, i.e., upper portions of the first sidewall spacers 22 that are not covered by the second sidewall spacers 30 and that become exposed upon etching of the nitride cap 19, may be removed concurrently with removal of the nitride cap 19 using the nitride etchant. After removing the nitride cap 19 that overlies the P-type gate electrode structure 16, the second sidewall spacers 30 are removed. The second sidewall spacers 30 may be removed through anisotropic etching with a suitable oxide etchant such as, but not limited to, hydrofluoric acid. Because the etch mask 32 is generally formed from silicon dioxide, the etch mask 32 may be concurrently removed along with the second sidewall spacers 30, and the second sidewall spacers 30 that are adjacent to N-type gate electrode structure 17 are removed along with second sidewall spacers 30 that are adjacent to P-type gate electrode structure 16.

Figure 6:
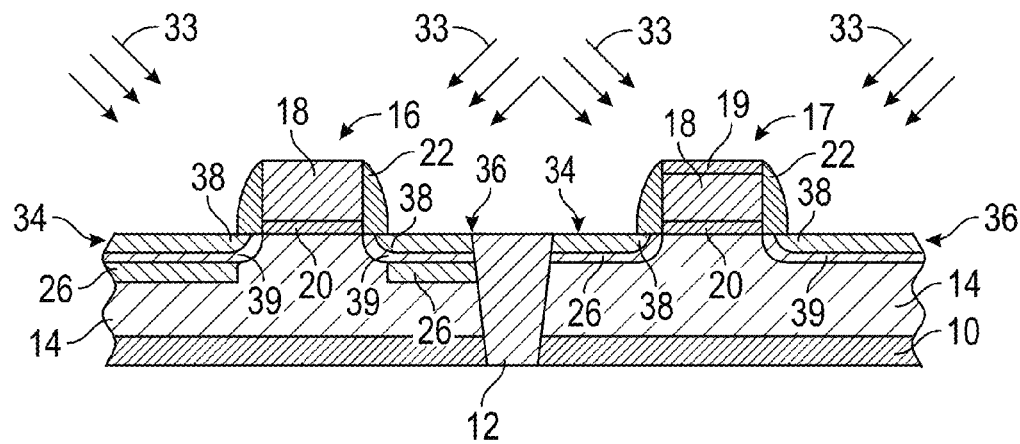

After removing the second sidewall spacers and as shown in FIG. 6, ion implantation is conducted by implanting conductivity determining ions 33 at various energies into the semiconductor substrate 10 using the P-type gate electrode structure 16 and the N-type gate electrode structure 17 as masks to form a source region 34 and drain region 36 for the various gate electrode structures 16, 17, including forming associated extension regions 38 and/or halo regions 39 as desired. In an embodiment and as shown in FIG. 6, extension regions 38 and/or halo regions 39 are formed for the respective source regions 34 and drain regions 36 of the P-type gate electrode structure 16 and the N-type gate electrode structure 17 through ion implantation using conventional techniques. In the embodiment shown in FIG. 6, the conductivity determining ions 33 are implanted into the semiconductor substrate 10 further using the first sidewall spacers 22 as a mask to form the extension regions 38 and/or the halo regions 39 for the respective source regions 34 and drain regions 36 of the P-type gate electrode structure 16 and the N-type gate electrode structure 17. As shown in FIG. 6, the nitride cap 19 remains only overlying the N-type gate electrode structure 17 during ion implantation to form the extension regions 38 and/or the halo regions 39.

Figure 7:
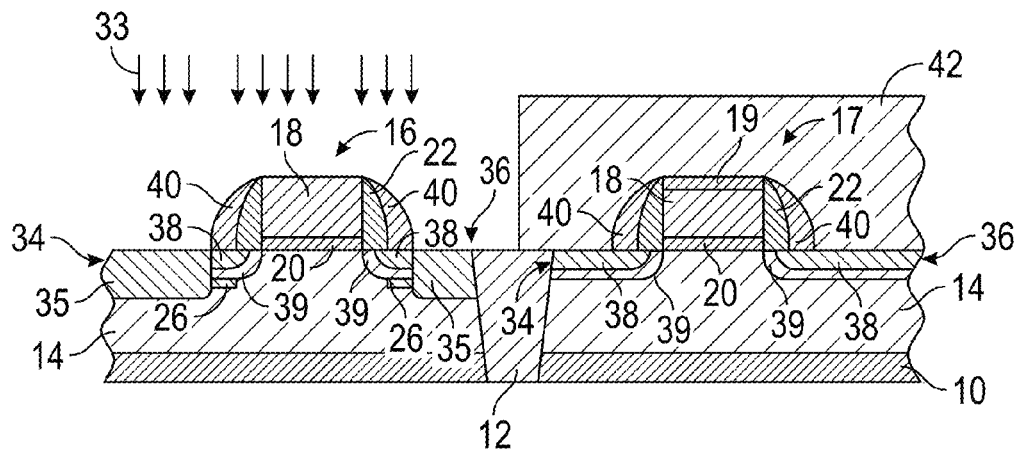

In an embodiment and as shown in FIG. 7, third sidewall spacers 40 are formed adjacent to the first sidewall spacers 22 after forming the extension regions 38 and/or halo regions 39 for the respective source regions 34 and drain regions 36 of the P-type gate electrode structure 16 and the N-type gate electrode structure 17. The third sidewall spacers 40 are formed from a nitride, and the third sidewall spacers 40 may have the same nominal composition as the first sidewall spacers 22. The third sidewall spacers 40 are used as a mask to control deep ion implantation into the semiconductor substrate 10 for the respective source regions 34 and drain regions 36 of the P-type gate electrode structure 16 and the N-type gate electrode structure 17, and the third sidewall spacers 40 generally overlie at least the extension regions 38 in the source regions 34 and drain regions 36. After formation of the third sidewall spacers 40, one of the gate electrode structures 16 is selectively masked with a first implant mask 42, leaving the other gate electrode structure exposed 17 where ion implantation is desired to further form the source regions 34 and drain regions 36 for the exposed gate electrode structure 17. The first implant mask 42 may be formed from an oxide such as, for example, silicon dioxide. In the embodiment shown in FIG. 7, the N-type gate electrode structure 17 is masked with the first implant mask 42, with deep implants 35 formed through ion implantation for the source region 34 and drain region 36 of the P-type gate electrode structure 16. P-type conductivity determining ions 33, such as those described above including boron, are used for ion implantation to form the deep implants 35 for the P-type gate electrode structure 16. After forming the deep implants 35 for the P-type gate electrode structure 16, the first implant mask 42 is removed, for example, through anisotropic etching with a suitable oxide etchant.

Figure 8:
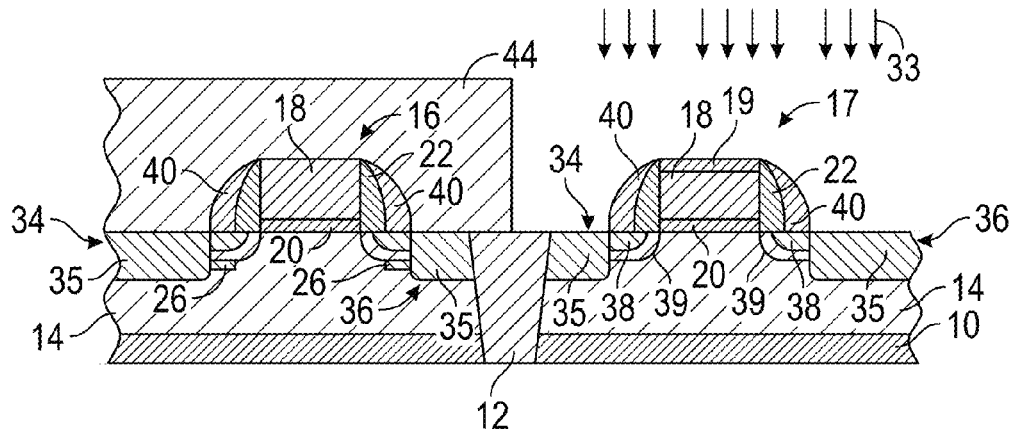

In an embodiment and as shown in FIG. 8, after removing the first implant mask, a second implant mask 44 is formed over the gate electrode structure 16 for which the deep implants 35 have already been formed. In the embodiment shown in FIG. 8, the N-type gate electrode structure 17 is exposed, with the P-type gate electrode structure 16 masked with the second implant mask 44. Deep implants 35 are formed through ion implantation for the source region 34 and drain region 36 of the N-type gate electrode structure 17, using the third sidewall spacers 40 as a mask to form the deep implants 35 for the source region 34 and drain region 36 of the N-type gate electrode structure 17. N-type conductivity determining ions 33, such as those described above including phosphorus, are used for ion implantation to form the deep implants 35 for the N-type gate electrode structure 17. The nitride cap 19 remains overlying the N-type gate electrode structure 17 during implantation of the conductivity determining ions 33 into the semiconductor substrate 10 to form the source region 34 and the drain region 36 for the N-type gate electrode structure 17, including during formation of the deep implants 35. The presence of the nitride cap 19 prevents formation of a mushroom geometry in the N-type gate electrode structure 17, which may otherwise occur in the absence of the nitride cap 19 due to the particular N-type conductivity determining ions 33 that are implanted to form the source region 34 and drain region 36 for the N-type gate electrode structure 17. In particular, formation of the mushroom geometry is often associated with phosphorus ion implantation.

Figure 9:
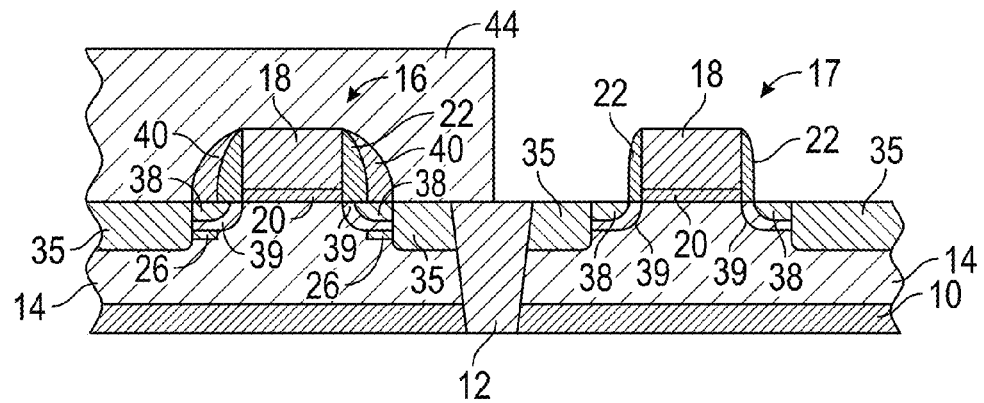

Instead of immediately removing the second implant mask 44, the nitride cap 19 is removed from the N-type gate electrode structure 17 after implanting the conductivity determining ions 33 into the semiconductor substrate 10 to form the source region 34 and drain region 36 for the N-type gate electrode structure 17, with the second implant mask 44 remaining in place. In an embodiment, the nitride cap 19, the first sidewall spacers 22, and the third sidewall spacers 40 have the same nominal composition. In this embodiment, the third sidewall spacers 40 and the nitride cap 19 may be concurrently removed from the N-type gate electrode structure 17 using an appropriate nitride etchant as described above, resulting in the configuration shown in FIG. 9. Further, in this embodiment, the first sidewall spacers 22 that are adjacent to the N-type gate electrode structure 17 may be thinned during removal of the third sidewall spacers 40 from adjacent the N-type gate electrode structure 17, resulting in the configuration shown in FIG. 9. In an embodiment, the first sidewall spacers 22 that are adjacent to the N-type gate electrode structure 17 may be thinner than the first sidewall spacers 22 that are adjacent to the P-type gate electrode structure 16. For example and as shown in FIG. 10, a combined width 46 of the N-type gate electrode structure 17 and the first sidewall spacers 22 that are adjacent to the N-type gate electrode structure 17 is less than a combined width 48 of the P-type gate electrode structure 16 and the first sidewall spacers 22 adjacent to the P-type gate electrode structure 16. Because the second implant mask 44 remains in place during removal of the third sidewall spacers 40 that are adjacent to the N-type gate electrode structure 17, the third sidewall spacers 40 that are adjacent to the P-type gate electrode structure 16 also remain in place and are unaffected by the nitride etchant that is used to remove the nitride cap 19 and the third sidewall spacers 40 from adjacent the N-type gate electrode structure 17. In this embodiment and as shown in FIGS. 9 and 10, the third sidewall spacers 40 are only disposed adjacent to the P-type gate electrode structure 16 and are absent from adjacent the N-type gate electrode structure 17.

Figure 10:
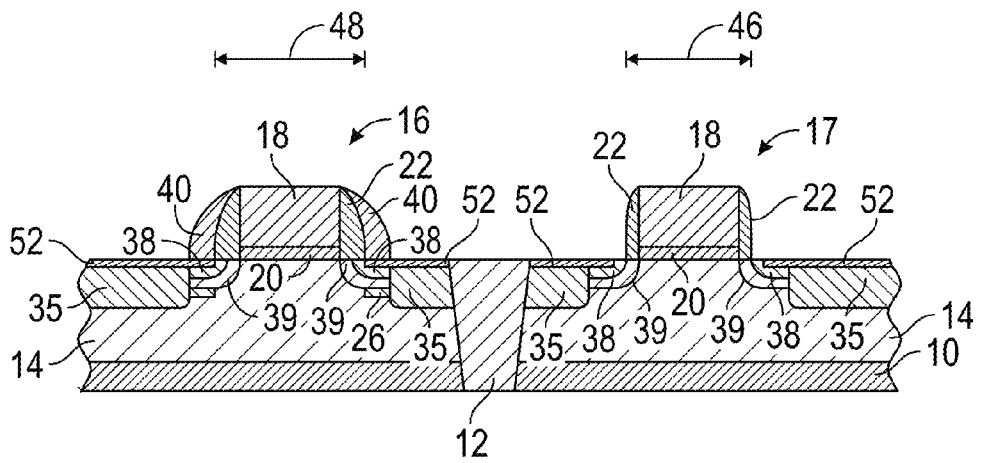

Referring to FIG. 10, a portion of an integrated circuit 54 is shown after forming the deep implants 35 for the N-type gate electrode structure 17 and removing the nitride cap and third sidewall spacers from adjacent the N-type gate electrode structure 17. The second implant mask is removed, such as through anisotropic etching with a suitable oxide etchant. In an embodiment and as shown in FIG. 10, after completing ion implantation and removing the second implant mask, a silicide layer 52 may be formed in the source regions 34 and drain regions 36. The silicide layer 52 is generally disposed overlying the source regions 34 and the drain regions 36 to facilitate electrical connection to the source regions 34 and the drain regions 36 with electrical interconnects (not shown). Although not shown, further structure may then be formed overlying the gate electrode structures 16, 17, silicide layer 52, and semiconductor substrate 10 in accordance with conventional integrated circuit fabrication.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for fabricating an integrated circuit, wherein the method comprises:

forming a P-type gate electrode structure and an N-type gate electrode structure overlying a semiconductor substrate, wherein the gate electrode structures each comprise a gate electrode overlying a gate dielectric layer and a nitride cap overlying the gate electrode;

forming first sidewall spacers comprising a nitride adjacent to the P-type gate electrode structure and the N-type gate electrode structure;

etching trenches into the semiconductor substrate adjacent the P-type gate electrode structure and epitaxially growing a semiconductor material within the trenches after forming the first sidewall spacers;

forming second sidewall spacers having a different etch rate from the first spacer adjacent to the first sidewall spacers after epitaxially growing the semiconductor material within the trenches;

removing the nitride cap from the P-type gate electrode structure, and removing a portion of the first sidewall spacers adjacent to the P-type gate electrode structure;

removing the second sidewall spacers adjacent to the P-type gate electrode structure and the N-type gate electrode structure;

implanting conductivity determining ions into the semiconductor substrate using using the first sidewall spacers, the P-type gate electrode structure, and the N-type gate electrode structure as masks to form an extension region and/or a halo region for the respective source regions and drain regions of the P-type gate electrode structure and the N-type gate electrode structure, wherein the nitride cap remains overlying the N-type gate electrode structure during implantation of the conductivity determining ions into the semiconductor substrate to form the extension region and/or a halo region for the N-type gate electrode structure;

forming third sidewall spacers comprising a nitride adjacent to the first sidewall spacers after forming the extension region and/or the halo region for the respective source regions and drain regions of the P-type gate electrode structure and the N-type gate electrode structure;

implanting conductivity determining ions into the semiconductor substrate using the third sidewall spacers as a mask to form deep implants for the respective source regions and drain regions of the P-type gate electrode structure and the N-type gate electrode structure, wherein the nitride cap remains overlying the N-type gate electrode structure during implantation of the conductivity determining ions into the semiconductor substrate to form the deep implants for the N-type gate electrode structure;

removing the nitride cap from the N-type gate electrode structure after implanting the conductivity determining ions into the semiconductor substrate to form the deep implants for the N-type gate electrode structure;

further comprising removing the third sidewall spacers from adjacent the N-type gate electrode structure, wherein the third sidewall spacers remain in place adjacent to the P-type gate electrode structure.

2. The method of claim 1, wherein removing the nitride cap from the N-type gate electrode structure comprises concurrently removing the third sidewall spacers and the nitride cap from the N-type gate electrode structure.

3. The method of claim 1, further comprising thinning the first sidewall spacers adjacent the N-type gate electrode structure during removal of the third sidewall spacers from adjacent the N-type gate electrode structure.

4. The method of claim 1, further comprising forming a silicide layer in the source regions and the drain regions after forming the source regions and drain regions.

* * * * *